United States Patent
Yang et al.

(10) Patent No.: US 9,202,696 B2
(45) Date of Patent: Dec. 1, 2015

(54) METHOD FOR DESIGNING ANTENNA CELL THAT PREVENTS PLASMA INDUCED GATE DIELECTRIC DAMAGE IN SEMICONDUCTOR INTEGRATED CIRCUITS

(71) Applicant: Taiwan Semiconductor Manufacturing Co., Ltd., Hsin-Chu (TW)

(72) Inventors: Jen-Hang Yang, Yonghe (TW); Chun-Fu Chen, Chiayi (TW); Pin-Dai Sue, Tainan (TW); Hui-Zhong Zhuang, Kaohsiung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 14/511,932

(22) Filed: Oct. 10, 2014

(65) Prior Publication Data

US 2015/0031194 A1 Jan. 29, 2015

Related U.S. Application Data

(62) Division of application No. 13/316,807, filed on Dec. 12, 2011, now Pat. No. 8,872,269.

(51) Int. Cl.
| | |
|---|---|
| *H01L 21/8234* | (2006.01) |
| *H01L 21/28* | (2006.01) |
| *H01L 27/02* | (2006.01) |
| *H01L 27/06* | (2006.01) |
| *H01L 21/283* | (2006.01) |
| *H01L 21/768* | (2006.01) |
| *H01L 23/60* | (2006.01) |
| *H01L 27/08* | (2006.01) |

(52) U.S. Cl.
CPC ........ *H01L 21/28008* (2013.01); *H01L 21/283* (2013.01); *H01L 21/76895* (2013.01); *H01L 23/60* (2013.01); *H01L 27/0207* (2013.01); *H01L 27/0629* (2013.01); *H01L 27/0811* (2013.01)

(58) Field of Classification Search
CPC .................................................. H01K 27/0727
USPC ........... 257/368, E21.705, E21.539, E27.033; 438/237
See application file for complete search history.

(56) References Cited

U.S. PATENT DOCUMENTS

| | | | | |
|---|---|---|---|---|
| 3,470,390 A | | 9/1969 | Lin | |
| 6,028,580 A | * | 2/2000 | Kosegawa et al. | 345/98 |
| 6,034,433 A | | 3/2000 | Beatty | |
| 2006/0065933 A1 | | 3/2006 | Chu et al. | |

\* cited by examiner

*Primary Examiner* — Robert Huber
(74) *Attorney, Agent, or Firm* — Duane Morris LLP

(57) ABSTRACT

An antenna cell for preventing plasma enhanced gate dielectric failures, is provided. The antenna cell design utilizes a polysilicon lead as a gate for a dummy transistor. The polysilicon lead may be one of a group of parallel, nested polysilicon lead. The dummy transistor includes the gate coupled to a substrate maintained at $V_{SS}$, either directly through a metal lead or indirectly through a tie-low cell. The gate is disposed over a dielectric disposed over a continuous source/drain region in which the source and drain are tied together. A diode is formed with the semiconductor substrate within which it is formed. The source/drain region is coupled to another metal lead which may be an input pin and is coupled to active transistor gates, preventing plasma enhanced gate dielectric damage to the active transistors.

17 Claims, 4 Drawing Sheets

METHOD FOR DESIGNING ANTENNA CELL THAT PREVENTS PLASMA INDUCED GATE DIELECTRIC DAMAGE IN SEMICONDUCTOR INTEGRATED CIRCUITS

RELATED APPLICATIONS

This application is a divisional of U.S. patent application Ser. No. 13/316,807, filed on Dec. 12, 2011 the contents of which are hereby incorporated by reference as if set forth in their entirety.

TECHNICAL FIELD

The disclosure relates to semiconductor devices and methods for manufacturing the same. More particularly, the disclosure relates to an antenna cell to prevent plasma induced gate dielectric damage, also known as the antenna effect.

BACKGROUND

Integrated circuits and other semiconductor devices are formed to include a multitude of individual transistors coupled together and to various other features to form functional devices. If any one of the transistors fails, device functionality can be destroyed. In advanced semiconductor device fabrication and manufacturing, plasma chemistry operations are typically used multiple times in the sequence of fabrication operations used to form virtually all integrated circuit and other semiconductor devices. Plasma operations include plasma etching operations and plasma deposition operations. Plasma vapor deposition, PVD, and plasma enhanced chemical vapor deposition, PECVD, represent just two of many plasma deposition operations.

The plasma operations utilize excited ions and these ions are typically directed to the surface substrate, often at high biases. The excited, accelerated ions of the plasma species can cause damage to the previously formed features. Reactive ion etch (RIE) operations and other operations that utilize ion bombardment, can also damage existing features and the damage caused to the existing features is often collectively referred to as plasma induced damage.

The highly sensitive transistors utilized in integrated circuits and other semiconductor devices, commonly include polysilicon or metal gates positioned over a gate dielectric which may be an oxide or other gate dielectric material. Plasma induced gate dielectric damage is commonly referred to as the antenna effect, and is an effect that damages transistor gates and the transistor gate dielectric materials and can potentially cause yield and reliability problems during the manufacture of MOS integrated circuits. Device functionality can be destroyed if the gate dielectric damage is severe.

It would therefore be desirable and advantageous to provide structures that eliminate or alleviate any plasma induced gate dielectric damage.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The disclosure provides a structure for alleviating antenna rule violations in integrated circuit chip designs. The disclosure also provides a method for forming the structure and integrating the formation of the structure into the processing operations used to form various different integrated circuit devices. Antenna rules are rules that must be obeyed in chip design to avoid plasma induced gate dielectric damage which is also known as the antenna effect. The antenna effect can cause breakdown of gate dielectric materials and gate electrodes, when conductive features such as interconnect metal leads are coupled to the polysilicon or other gate electrodes of a transistor and become highly charged due to plasma processing operations or other operations carried out upon the structures. If a significant amount of electrical charges are accumulated on a conductive lead that is connected to a transistor gate electrode, the transistor can be destroyed due to this antenna effect.

The disclosed antenna cell structure alleviates plasma induced gate dielectric damage, i.e., the antenna effect. Antenna cells contain structures to prevent and alleviate the antenna effect. Many antenna cells must be formed using dedicated real estate for various reasons. One such reason is the requirement that, when polysilicon leads are formed, they are often formed in a group of several parallel lines formed in close proximity and having substantially the same length. Some exemplary antenna cells cannot use such a nested polysilicon lead, and are advantageously formed in a separately apportioned antenna cell area.

The disclosure provides antenna cells that utilize polysilicon leads such as may be formed closely nested with other parallel polysilicon leads.

Figure 1:
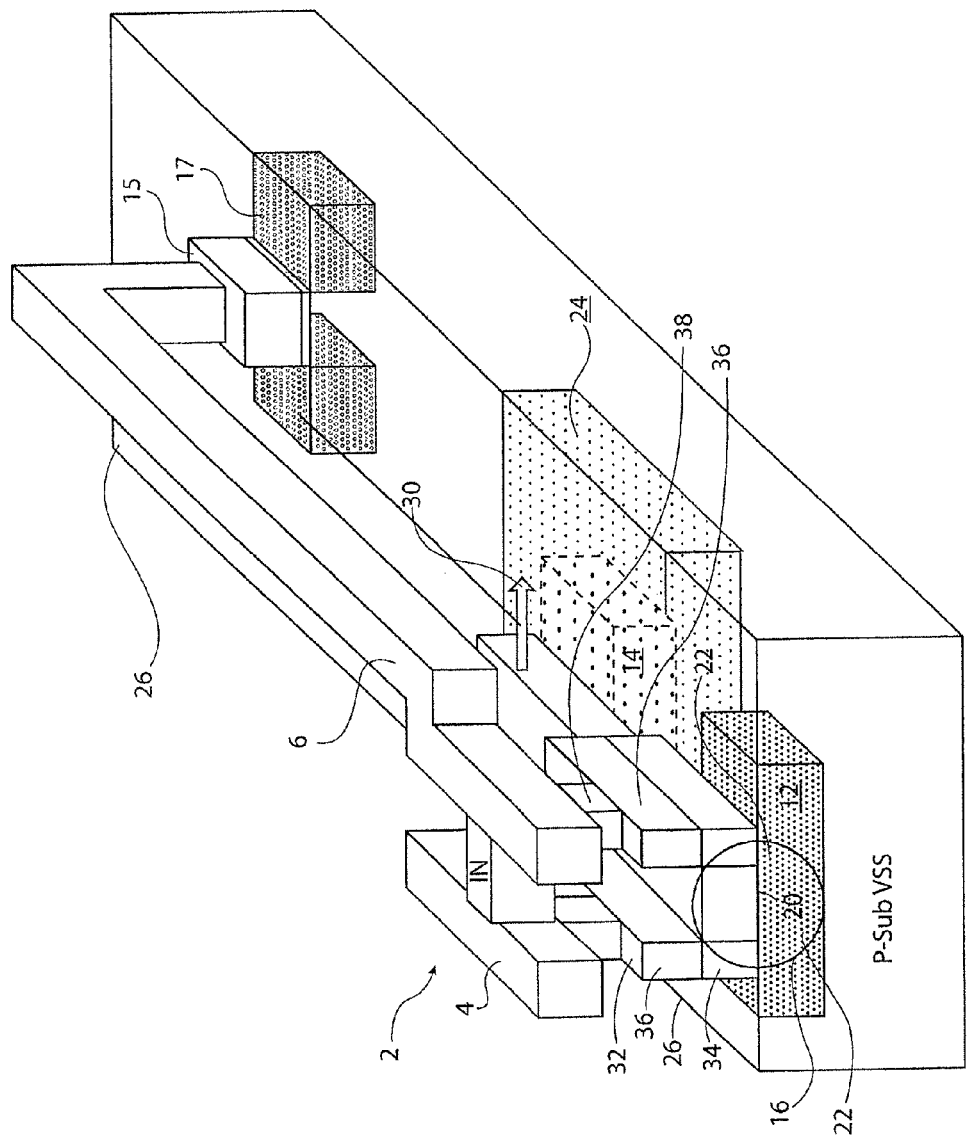
FIG. 1 is a three-dimensional, cross-sectional perspective view showing a portion of an exemplary antenna cell structure according to the disclosure.

FIG. 1 shows exemplary antenna diode structure 2, which is a CMOS structure and may be formed in a dedicated antenna cell or at various other locations within an integrated circuit such as a logic or memory device or other semiconductor devices. Metal lead 4 is an input pin to antenna diode structure 2 and may be formed of various suitable conductive materials and using various patterning operations. Metal lead 4 is connected to a routing metal line (not shown) and forms a discharging path to the substrate. Metal lead 4 is also coupled by metal lead 6 to active gates 15 of active transistors 17 of the integrated circuit such as may be susceptible to plasma induced gate dielectric damage, also known as the antenna effect. Semiconductor substrate 10 may be a silicon or other suitable semiconductor substrate and includes top surface 26. In the illustrated embodiment, semiconductor substrate 10 is a P-type substrate coupled to a Vss source, but N-type substrates may be used in other exemplary embodiments. Active area 12 is formed within semiconductor substrate 10 and extends downwardly from substrate surface 26. According to the exemplary embodiment in which semiconductor substrate 10 is a P-type material, active area 12 is an N-type active area. Generally stated, active area 12 will be of the opposite polarity of semiconductor substrate 10. Also according to the exemplary embodiment in which semiconductor substrate 10 is a P-type material, N well area 24 includes active area 14 which is a P-type active area.

Dummy transistor 16 is generally shown in the circled area. Dummy transistor 16 is an NMOS transistor in the exemplary embodiment and includes dummy transistor gate 18 which is advantageously formed of polysilicon. The polysilicon lead that forms dummy transistor gate 18 may be one of a plurality of substantially parallel polysilicon leads of the same length, as will be shown below. A gate dielectric such as a gate oxide is disposed at interface 20 between transistor gate 18 and active area 12 which is an N-type active area in the exemplary embodiment. Active area 12 is a unitary, i.e. continuous dopant impurity region that extends from the location of a source region of dummy transistor 16 to the location of a drain region of dummy transistor 16 without different doping characteristics for a channel as in an active transistor. Dummy transistor 16 includes source/drain regions 22 which are thus electrically tied together. Metal lead 4 is coupled to each of the source/drain regions 22 by a respective conductive structure 34. Each conductive structure 32 is formed of conductive via 38, lower conductive metal segment 34 and upper conductive metal segment 36 in the illustrated embodiment but different connective conductive features may be used in other embodiments. In one embodiment, lower conductive metal segment 34 is formed of tungsten and upper conductive metal segment 36 is formed of copper but other suitable conductive materials may be used in other embodiments. Metal lead 4 is therefore coupled to each source/drain region 22 which are coupled together to avoid leakage. Dummy transistor gate 18 is coupled 30 (as indicated by the arrow) to substrate 10 which is a P-type substrate held at Vss either directly or indirectly as indicated below.

Each of the aforementioned features may be formed using known or later developed processes and various suitable materials. The formation of antenna diode structure 2 may be carried out using the same processing operations simultaneously used to form the other features of the integrated circuit or other semiconductor device within which antenna diode structure is incorporated.

Figure 2B:
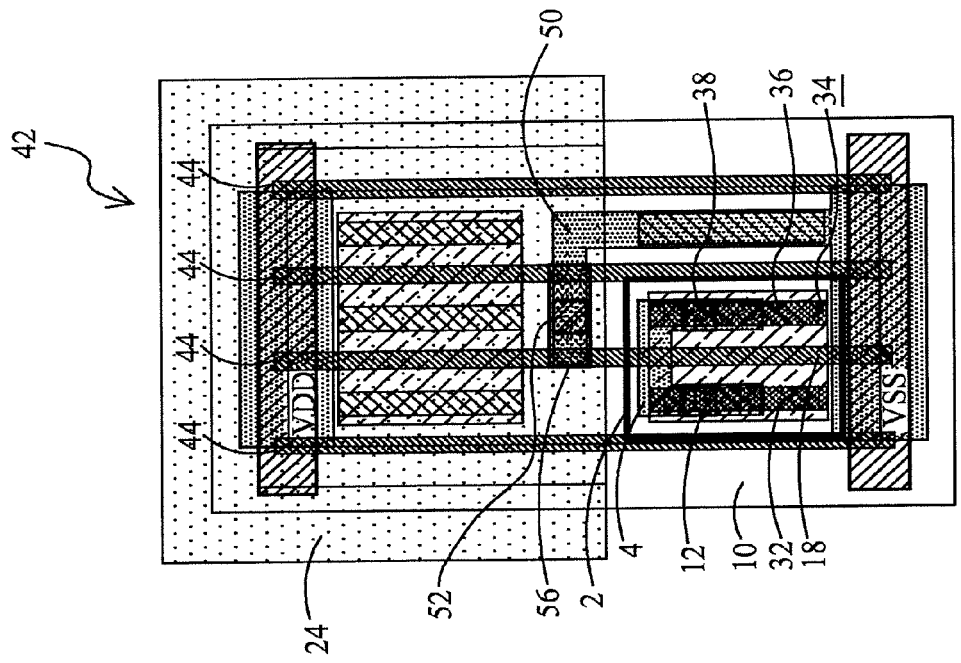
FIGS. 2A and 2B are a circuit diagram and a device layout, respectively, of an exemplary antenna cell structure according to the disclosure.
Figure 2A:
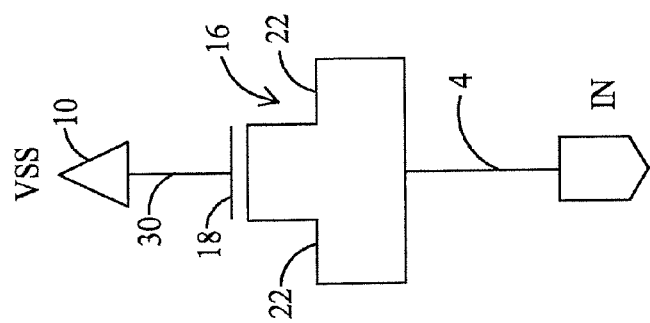

According to one exemplary embodiment, dummy transistor gate 18 may be directly coupled to semiconductor substrate 10 and Vss directly, e.g. coupled to semiconductor substrate 10 by a further metal lead. This direct coupling is illustrated in the circuit diagram of FIG. 2A and the exemplary antenna cell layout of FIG. 2B. FIG. 2A shows source/drain regions 22 tied together and to metal lead 4, which may be an input pin, as described above. Substrate 10 is held at Vss and coupled 30 to dummy transistor gate 18. FIG. 2B shows exemplary antenna cell layout 42, including a plurality of substantially parallel polysilicon leads 44 which include substantially the same length. One of these polysilicon leads 44 forms dummy transistor gate 18 in antenna diode structure 2 as indicated in FIG. 2B. Antenna cell layout 42 also shows metal lead 4, which may be an input pin or coupled to an input pin, and active area 12. Active area 12 is formed in a region of semiconductor substrate 10 that is held at Vss. A diode is formed at the intersection between active area 12 and semiconductor substrate 10 as shown in FIGS. 1 and 2B. Metal lead 4 is coupled to source/drain regions of active area 12 by conductive structures 32 as described above, and conductive via 38. Antenna cell layout 42 of FIG. 2B shows an exemplary connection between dummy polysilicon gate 18 of dummy transistor 16, and semiconductor substrate 10 such as through conductive via 38 and conductive segments 36 and 34, such as also represented in the circuit diagram of FIG. 2A. Dummy transistor 16, an NMOS transistor in the exemplary embodiment, may be turned off to avoid leakage by providing a logic "O" to dummy transistor 16, to turn it off. Metal lead 50 and conductive vias 52 and 56 may also be used for conductive coupling of components on various exemplary embodiments.

Figure 3A:
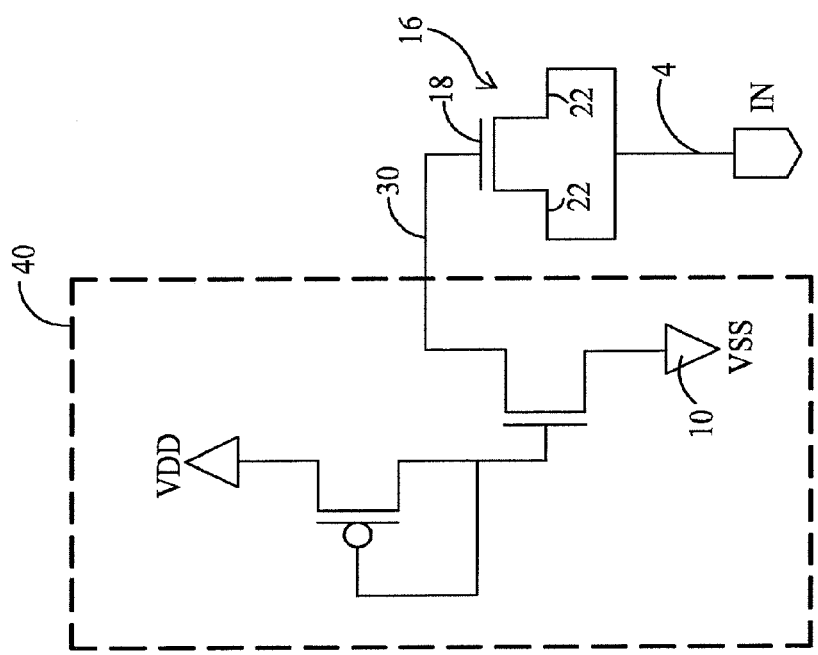
FIGS. 3A and 3B are a circuit diagram and a device layout, respectively, of another exemplary antenna cell structure according to the disclosure.
Figure 3B:
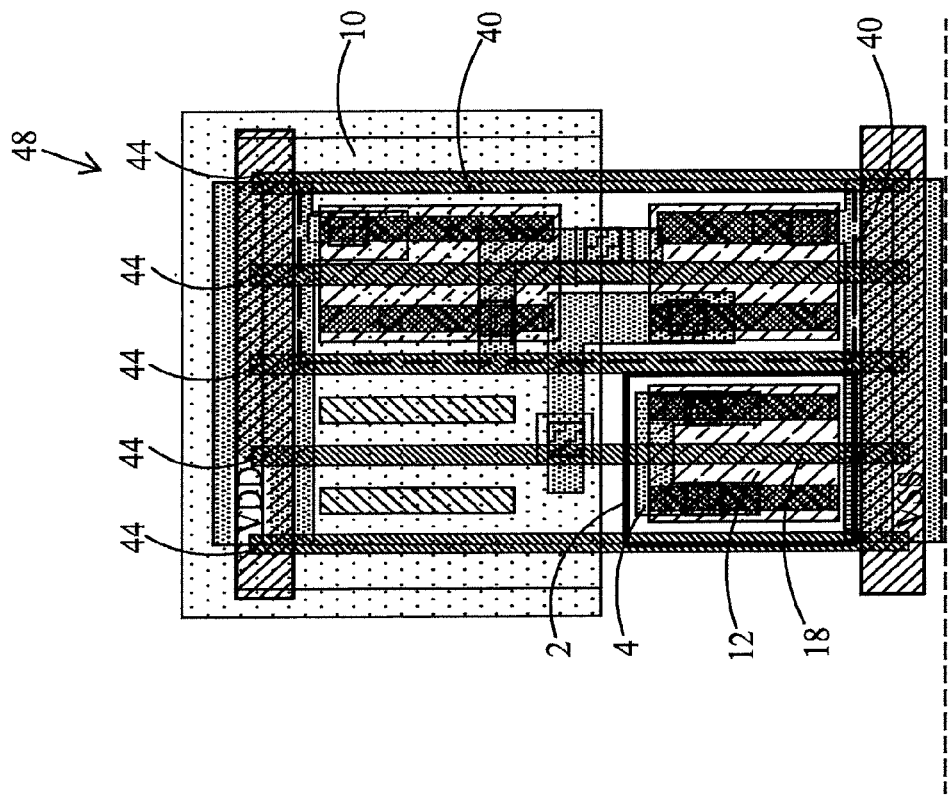

According to another exemplary embodiment such as illustrated in FIGS. 3A and 3B, dummy transistor gate 18 of dummy transistor 16 may be coupled to the substrate, i.e. to Vss using a tie-low cell. Tie-low cells are known in the art and are used to provide ESD protection, i.e. protection against electrostatic discharge (ESD) by avoiding direct connection between a gate such as dummy transistor gate 18 and power/ground such as semiconductor substrate 10. FIG. 3A is a circuit diagram with similar features to the circuit diagram of FIG. 2A and shows source/drain regions 22 tied together and to metal lead 4. In the circuit diagram of FIG. 3A, however, dummy polysilicon gate 18 is coupled 30 to semiconductor substrate 10 and Vss indirectly through tie-low cell 40.

Tie-low cell 40 is also indicated by the dashed lines in the exemplary antenna cell layout 48 of FIG. 3B which also includes a plurality of parallel polysilicon leads 44 that have substantially the same length. One such polysilicon lead 44 is used as dummy gate electrode 18 in antenna diode structure 2. In antenna cell layout 48 of FIG. 3B, antenna diode structure 2 is substantially the same as antenna diode structure 2 shown in FIG. 2B. Tie-low cell 40 provides ESD protection, a logic "O" and indirect connection to semiconductor substrate 10 and Vss. It should be emphasized that tie-low cell 40 shown in FIGS. 3A and 3B is exemplary only and other tie-low cell structures such as may be known in the art or later developed, may be used to indirectly couple dummy gate electrode 18 to the semiconductor substrate and the $V_{SS}$ voltage source. Such tie-low cells may be part of a standard-cell library and are used to connect transistor gates to either power or ground.

According to one aspect, a semiconductor structure for alleviating plasma induced gate dielectric damage in a semiconductor device, is provided. The semiconductor structure comprises: at least one active transistor having an active polysilicon gate; a metal lead coupled to the at least one active polysilicon gate; and a diode coupling the metal lead to $V_{SS}$ through a dummy transistor comprising a dummy polysilicon transistor gate disposed over a gate dielectric disposed over a continuous source/drain dopant impurity region. The diode comprises the metal lead coupled to the continuous source/drain dopant impurity region and the dummy polysilicon transistor gate coupled to the $V_{SS}$.

According to another aspect, a semiconductor structure for alleviating plasma induced gate dielectric damage in a semiconductor device, is provided. The semiconductor structure comprises: at least one active transistor having an active polysilicon gate and formed on a semiconductor substrate; a metal lead coupled to the at least one active polysilicon gate; and a diode coupling the metal lead to the semiconductor substrate through a dummy transistor. The dummy transistor comprises a dummy polysilicon transistor gate disposed over a gate dielectric disposed over a continuous source/drain dopant impurity region, the diode comprising the metal lead coupled to the continuous source/drain dopant impurity region and the dummy polysilicon transistor gate coupled to the semiconductor substrate.

According to another aspect, a method for forming a semiconductor structure for alleviating plasma induced gate dielectric damage in a semiconductor device, is provided. The method comprises: providing a semiconductor substrate; defining an antenna cell on a surface of the semiconductor substrate; forming a plurality of polysilicon lines having substantially the same length and extending completely through the cell; forming a dummy transistor using one the polysilicon line as a dummy gate thereof, the dummy transistor including the dummy gate disposed over a gate dielectric disposed over a continuous source/drain dopant impurity region; and forming a metal lead coupled to an active transistor gate and further coupled to a diode formed of the dummy transistor, wherein the dummy gate is coupled to the semiconductor substrate and the metal lead is coupled to the continuous source/drain dopant impurity region.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the device or structure be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents.

What is claimed is:

1. A method for forming a semiconductor structure, said method comprising:
    providing a semiconductor substrate;
    defining an antenna cell on a surface of said semiconductor substrate;
    forming a plurality of substantially parallel polysilicon lines having substantially the same length and extending completely through said cell;
    forming a dummy transistor using one said polysilicon line as a dummy gate thereof, said dummy transistor including said dummy gate disposed over a gate dielectric disposed over a continuous source/drain dopant impurity region; and
    forming a metal lead coupled to an active transistor gate and further coupled to a diode formed of said dummy transistor, wherein said dummy gate is coupled to said semiconductor substrate and said metal lead is directly coupled to said continuous source/drain dopant impurity region,
    wherein said continuous source/drain dopant impurity region is a single unitary region that extends underneath and past opposed sides of said dummy gate and all of said single unitary region has the same dopant impurity type.

2. The method as in claim 1, further comprising electrically coupling said semiconductor substrate to a $V_{SS}$ voltage source.

3. The method as in claim 2, wherein said dummy gate is directly coupled to said semiconductor substrate via a further metal lead.

4. The method as in claim 2, wherein said dummy gate is directly coupled to said semiconductor substrate via a tie-low cell.

5. The method as in claim 1, wherein said semiconductor substrate comprises a P-type substrate, said continuous source/drain dopant impurity region comprises an N-type material and said diode includes a P-N junction formed between said continuous source/drain dopant impurity region and said semiconductor substrate.

6. A method for forming a semiconductor structure, said method comprising:
    forming at least one active transistor having an active polysilicon gate over a surface of a semiconductor substrate;
    coupling a metal lead to said at least one active polysilicon gate; and
    further coupling said metal lead to $V_{SS}$ through a diode including a dummy transistor comprising a dummy polysilicon transistor gate disposed over a gate dielectric disposed over a continuous source/drain dopant impurity region, including directly coupling said metal lead to said continuous source/drain dopant impurity region and coupling said dummy polysilicon transistor gate to said $V_{SS}$;
    wherein said continuous source/drain dopant impurity region is a single unitary region that extends underneath and past opposed sides of said dummy polysilicon transistor gate and all of said single unitary region has the same dopant impurity type.

7. The method as in claim 6, further comprising maintaining said semiconductor substrate at said $V_{SS}$ and wherein said coupling said dummy polysilicon transistor gate to said $V_{SS}$ comprises coupling said dummy polysilicon transistor gate to said semiconductor substrate.

8. The method as in claim 7, wherein said coupling said dummy polysilicon transistor gate to said semiconductor substrate includes a coupling said dummy polysilicon transistor gate to said semiconductor substrate through a further metal lead.

9. A method as in claim 7, wherein said coupling said dummy polysilicon transistor gate to said semiconductor substrate comprises coupling said dummy polysilicon transistor gate to said semiconductor substrate through a tie-low cell.

10. The method as in claim 6, wherein said diode includes a P-N junction between said continuous source/drain dopant impurity region and said semiconductor substrate.

11. The method as in claim 6, further comprising defining an antenna cell on said surface and forming a plurality of substantially parallel polysilicon lines having substantially the same length and extending completely through said antenna cell, and wherein said dummy polysilicon transistor gate comprises one of said substantially parallel polysilicon lines.

12. The method as in claim 6, wherein said continuous source/drain dopant impurity region is an N-type region and extends up to said surface.

13. The method for forming a semiconductor structure, said method comprising:
provide a semiconductor substrate;
defining an antenna cell on a surface of said semiconductor substrate;
forming a plurality of polysilicon lines extending through said antenna cell;
forming a dummy transistor using one said polysilicon line as a dummy gate thereof, said dummy transistor including said dummy gate disposed over a gate dielectric disposed over a continuous unitary source/drain dopant impurity region; and
coupling an active transistor gate to a diode formed of said dummy transistor using a metal lead that is directly coupled to said continuous source/drain dopant impurity region,
wherein said continuous source/drain dopant impurity region is a single unitary region that extends underneath and past opposed sides of said dummy gate and all of said single unitary region has the same dopant impurity type.

14. The method as in claim 13, wherein said forming a plurality of polysilicon lines comprises forming a plurality of substantially parallel polysilicon lines.

15. The method as in claim 13, wherein said surface forms an upper boundary of said continuous unitary source/drain dopant impurity region.

16. The method as in claim 13, further comprising electrically coupling said semiconductor substrate to a $V_{SS}$ voltage source and coupling said dummy gate to said semiconductor substrate via a tie-low cell.

17. The method as in claim 13, wherein said continuous source/drain dopant impurity region is a first impurity type, said semiconductor substrate is a material of the opposite dopant impurity type and said diode comprises a P-N junction between said continuous source/drain dopant impurity region and said semiconductor substrate.

* * * * *